(12) United States Patent
Yoon

(10) Patent No.: US 6,788,599 B2
(45) Date of Patent: Sep. 7, 2004

(54) AUTO PRECHARGE APPARATUS HAVING AUTOPRECHARGE GAPLESS FUNCTION PROTECTING CIRCUIT IN SEMICONDUCTOR MEMORY DEVICE

(75) Inventor: Seok Cheol Yoon, Chungchongbuk-do (KR)

(73) Assignee: Hynix Semiconductor Inc., Ichon-shi (KR)

( * ) Notice: Subject to any disclaimer, the term of this patent is extended or adjusted under 35 U.S.C. 154(b) by 171 days.

(21) Appl. No.: 10/094,611

(22) Filed: Mar. 12, 2002

(65) Prior Publication Data

US 2003/0002371 A1 Jan. 2, 2003

(30) Foreign Application Priority Data

Jun. 29, 2001 (KR) ........................................ 2001-38032

(51) Int. Cl.[7] .............................. G11C 7/00; G11C 8/00
(52) U.S. Cl. ........................ 365/203; 365/193; 365/195; 365/230.03; 365/233; 365/189.08
(58) Field of Search ................................ 365/203, 193, 365/195, 233

(56) References Cited

U.S. PATENT DOCUMENTS

| 5,748,560 | A | * | 5/1998 | Sawada ....................... 365/233 |
| 5,995,404 | A | * | 11/1999 | Nakaumura et al. .......... 365/63 |
| 6,185,256 | B1 | * | 2/2001 | Saito et al. .................. 375/257 |
| 6,295,245 | B1 | * | 9/2001 | Tomita et al. ......... 365/230.08 |
| 6,343,036 | B1 | * | 1/2002 | Park et al. .................. 365/193 |
| 6,438,063 | B1 | * | 8/2002 | Lee ........................ 365/230.03 |
| 2002/0078311 | A1 | * | 6/2002 | Matsuzaki et al. .......... 711/149 |
| 2002/0108013 | A1 | * | 8/2002 | Coteus et al. .................. 711/2 |
| 2003/0103407 | A1 | * | 6/2003 | Ooishi et al. ................ 365/233 |
| 2003/0123320 | A1 | * | 7/2003 | Wright et al. ................ 365/233 |

* cited by examiner

Primary Examiner—David Nelms
Assistant Examiner—Ly Duy Pham
(74) Attorney, Agent, or Firm—Jacobson Holman PLLC

(57) ABSTRACT

An auto precharge apparatus having an auto precharge gapless function protecting circuit in a semiconductor memory device which can prevent an externally-inputted illegal command from being executed, by disabling a row active peri signal earlier than a row active core signal in an auto precharge operation. The auto precharge apparatus includes: an internal cas command signal generator for receiving a bank address and an external cas command signal, and generating an internal cas command signal; a burst length counter for receiving the internal cas command signal and a burst stop signal, and generating a burst end signal representative of an end of a burst operation; an auto precharge signal generator for receiving the burst end signal, the internal cas command signal, an auto precharge end signal and an external address, and generating an auto precharge peri signal and an auto precharge core signal; and an internal row active signal generator for receiving the auto precharge peri signal, the auto precharge core signal, a precharge signal and an externally-inputted row active signal, and generating a row active peri signal and a row active core signal.

14 Claims, 8 Drawing Sheets

AUTO PRECHARGE APPARATUS HAVING AUTOPRECHARGE GAPLESS FUNCTION PROTECTING CIRCUIT IN SEMICONDUCTOR MEMORY DEVICE

BACKGROUND OF THE INVENTION

1. Field of the Invention

The present invention relates to an auto precharge apparatus for a semiconductor memory device, and in particular to an improved auto precharge apparatus having an auto precharge gapless function protecting circuit, which can prevent a mis-operation of the semiconductor memory device.

2. Description of the Background Art

In general, a semiconductor memory device performs its operations according to an input command (for example, write/read command, precharge command, refresh command, etc.). Here, an illegal command can be inputted as the input command. The semiconductor memory device should not respond to the illegal command.

However, when a write/read command is inputted to the semiconductor memory device after an auto precharge operation, a chip is mis-operated due to absence of a circuit for protecting a gapless function.

A conventional auto precharge apparatus for a semiconductor memory device will be explained in detail with reference to FIGS. 1 and 2.

FIG. 1 is a block diagram illustrating the conventional autoprecharge apparatus, and FIG. 2 is a timing diagram of the major signals developed in the apparatus of FIG. 1.

Referring to FIG. 1, the conventional auto precharge apparatus includes a burst length counter 10, an auto precharge signal generator 20 and an internal row active signal generator 30.

The burst length counter 10 counts a burst length, calculates the number of data to be input/output, and transmits a burst end signal YBST_END. The auto precharge signal generator 20 confirms that an address <10> is inputted in a high level when receiving the burst end signal YBST_END, and if the address <10> is at a high level, it transmits an auto precharge command APCG. The internal row active signal generator 30 determines whether or not the row is active on the basis of the auto precharge signal APCG or a precharge signal PCG. That is, when receiving the precharge signal PCG, the internal row active signal generator 30 disables a word line, thereby performing precharge.

In FIG. 2, a second signal in which RAS transits to a low level is a row active signal ROWACT; a row active peri signal ROWACT_PE is activated and a main word line is enabled. Also, a third signal in which CAS transits to a low level is a read with auto precharge command. When burst length counting is ended and the address <10> is at a high level, the row active peri signal ROWACT_PE is converted to a low level and the main word line is disabled at a high level.

The conventional auto precharge apparatus performs a write/read operation, and then automatically disables a word line after waiting for tDPL (data_in to precharge latency) although a precharge command is not inputted. If the tDPL time is not compensated, data are not fully written on a cell, which may generate a defect.

As illustrated in FIG. 2, a fourth low level signal of cas signal is a read with auto precharge command. However, since the row active peri signal ROWACT-PERI is active, data read is caused.

As stated above, while the auto precharge apparatus waits for the tDPL, if an illegal command is inputted to a bank, a new operation in accordance with the illegal command is executed in a state where the word line is not disabled, thereby causing a mis-operation.

SUMMARY OF THE INVENTION

Accordingly, it is a primary object of the present invention to prevent a mis-operation due to an illegal command externally inputted during an auto precharge operation, by separating a path for controlling a peri circuit unit from a path for controlling a core circuit unit.

Another object of the present invention is to prevent an externally-inputted illegal command from being executed by disabling a row active peri signal for controlling a peri circuit unit earlier than a row active core signal for controlling a core circuit unit during an auto precharge operation.

In order to achieve the above-described objects of the invention, there is provided an auto precharge apparatus having an auto precharge gapless function protecting circuit in a semiconductor memory device, including: an internal cas command signal generating means for receiving a bank address and an external cas command signal and generating an internal cas command signal; a burst length counter for receiving the internal cas command signal and a burst stop signal, and generating a burst end signal representative of an end of a burst operation; an auto precharge signal generating means for receiving the burst end signal, the internal cas command signal, an auto precharge end signal and an external address and generating an auto precharge peri signal and an auto precharge core signal; and an internal row active signal generating means for receiving the auto precharge peri signal, the auto precharge core signal, a precharge signal and an externally-inputted row active signal and generating a row active peri signal for enabling a word line and a row active core signal for disabling the word line. The internal cas command signal generating means receives the row active peri signal for enabling the word line and determines generation of the internal cas command signal.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE PREFERRED EMBODIMENTS

An autoprecharge apparatus having an auto precharge gapless function protecting circuit in a semiconductor memory device in accordance with a preferred embodiment of the present invention will be described in detail with reference to the accompanying drawings.

Figure 1:
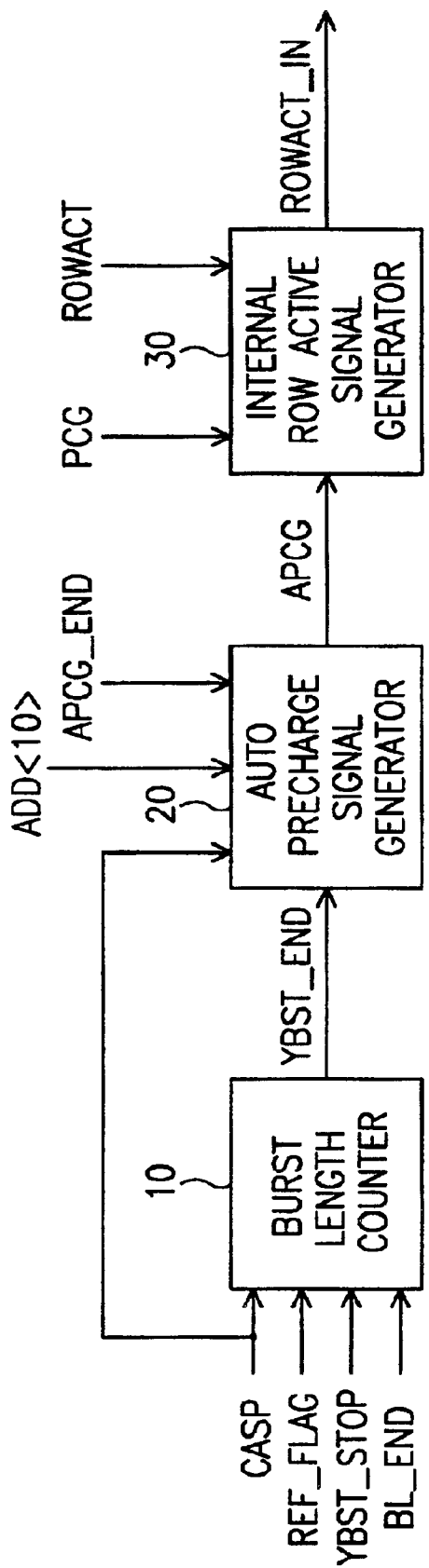
FIG. 1 is a block diagram illustrating a conventional auto precharge apparatus for a semiconductor memory device.
Figure 2:
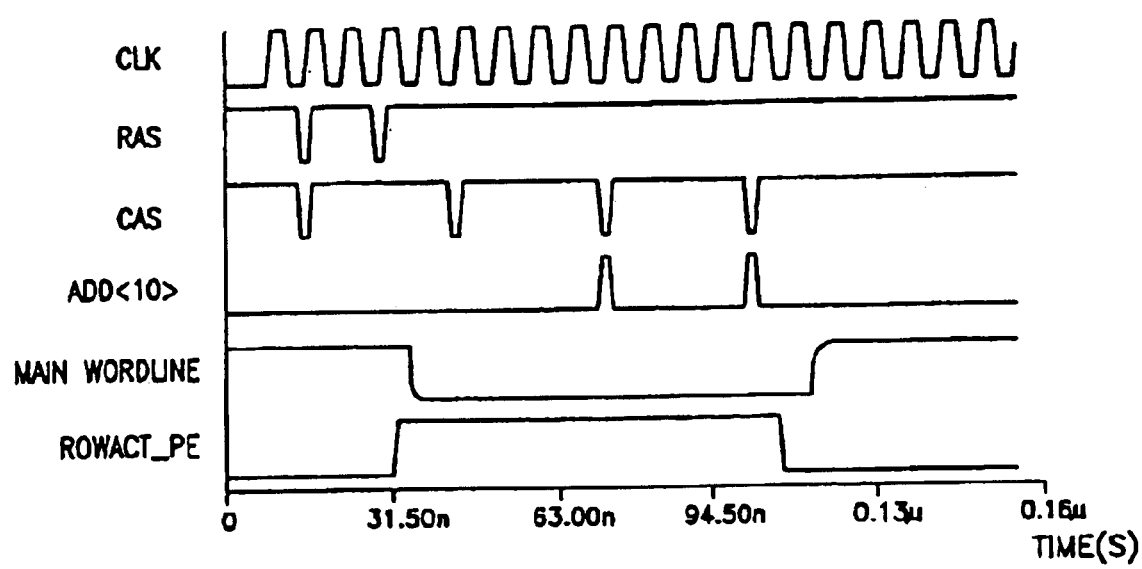
FIG. 2 is a timing diagram of the major signals of the conventional auto precharge apparatus for the semiconductor memory device.
Figure 3:
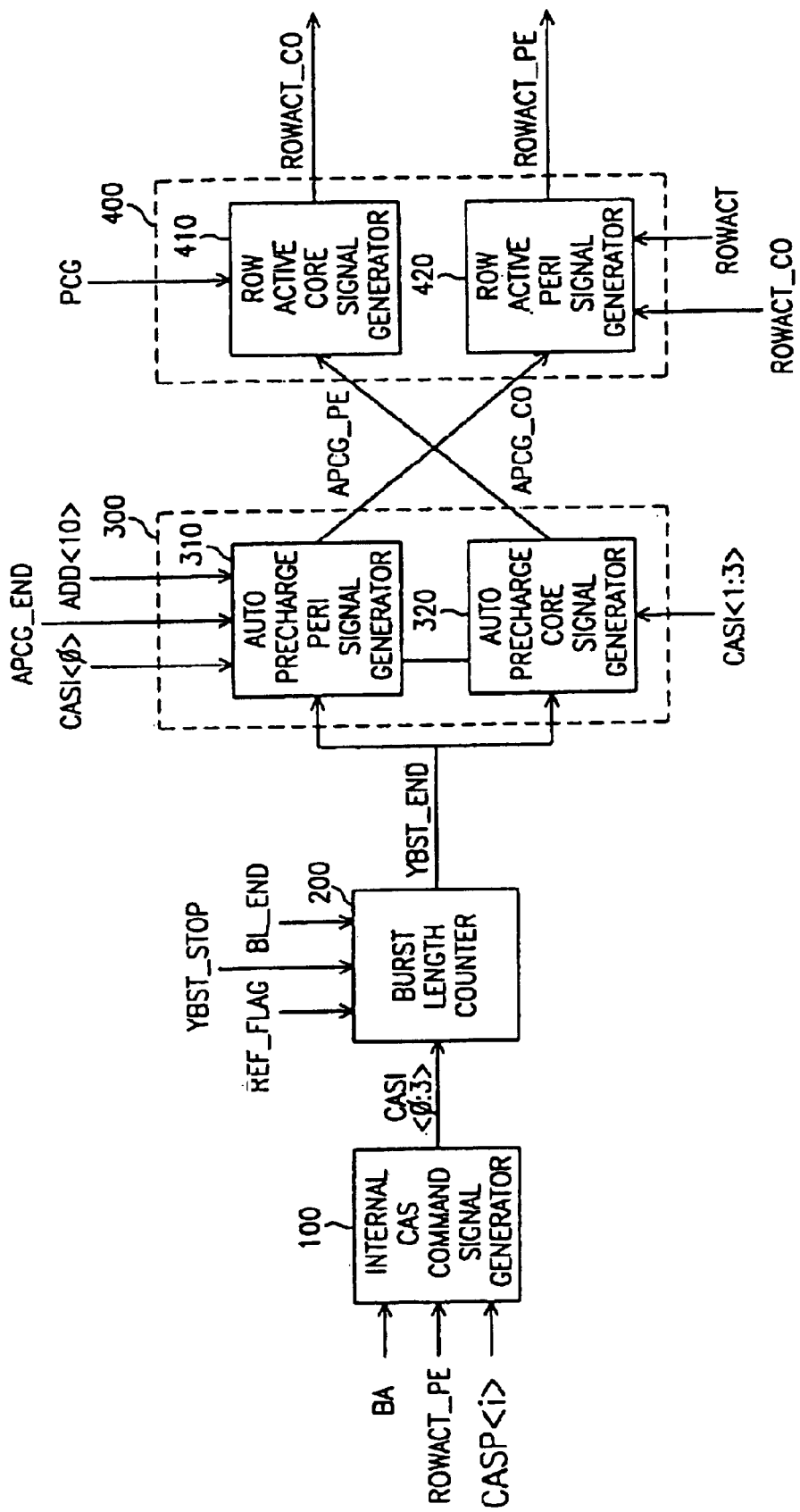
FIG. 3 is a block diagram illustrating an auto precharge apparatus having an auto precharge gapless function protecting circuit in a semiconductor memory device in accordance with a preferred embodiment of the present invention.

FIG. 3 is a block diagram illustrating the auto precharge apparatus having the auto precharge gapless function protecting circuit in accordance with the preferred embodiment of the present invention. The auto precharge apparatus includes: an internal cas command signal generator 100, a burst length counter 200, an auto precharge signal generator 300 and an internal row active signal generator 400.

Here, the internal cas command signal generator 100 receives an externally-inputted bank address BA, a row active peri signal ROWACT_PE and an external cas command signal CASP<i>, and generates an internal cas command signal CASI<0:3> in response to the row active peri signal ROWACT_PE. The row active peri signal ROWACT_PE is generated in a row active peri signal generator 420 that will be discussed later.

The burst length counter 200 receives the internal cas command signal CASI<0:3>, a refresh flag signal REF_FLAG indicating a refresh operation, a burst length end signal BL_END and a burst stop signal YBST_STOP, and generates a burst end signal YBST_END representative of an end of a burst operation.

The auto precharge signal generator 300 including an auto precharge peri signal generator 310 and an auto precharge core signal generator 320 receives the burst end signal YBST_END, the internal cas command signal CASI<0:3>, an auto precharge end signal APCG_END and an external address ADD<10>, and generates an auto precharge peri signal APCG-PE and an auto precharge core signal APCG_CO. That is, the auto precharge peri signal generator 310 transmits the auto precharge peri signal APCG_PE to disable the row active peri signal for preventing write and read operation from being performed. The auto precharge core signal generator 320 transmits the auto precharge core signal APCG_CO for disabling and controlling a word line to be precharged.

The internal row active signal generator 400 including a row active core signal generator 410 and a row active peri signal generator 420 receives the auto precharge peri signal APCG-PE, the auto precharge core signal APCG-CO, a precharge signal PCG, a row active signal ROWACT and a row active core signal ROWACT_CO, and generates the row active core signal ROWACT_CO for disabling a word line and the row active peri signal ROWACT_PE for enabling the word line. That is, the row active core signal generator 410 generates the row active core signal ROWACT_CO for disabling a word line in response to the auto precharge core signal APCG_CO, and the row active peri signal generator 420 generates the row active peri signal ROWACT_PE for enabling a word line.

Here, the row active core signal ROWACT_CO is generated in response to the auto precharge core signal APCG_CO, and the row active peri signal ROWACT_PE is generated in response to the auto precharge peri signal APCG_PE.

The structure and operation of the internal cas command signal generator 100 will be explained with reference to FIG. 4.

Figure 4:
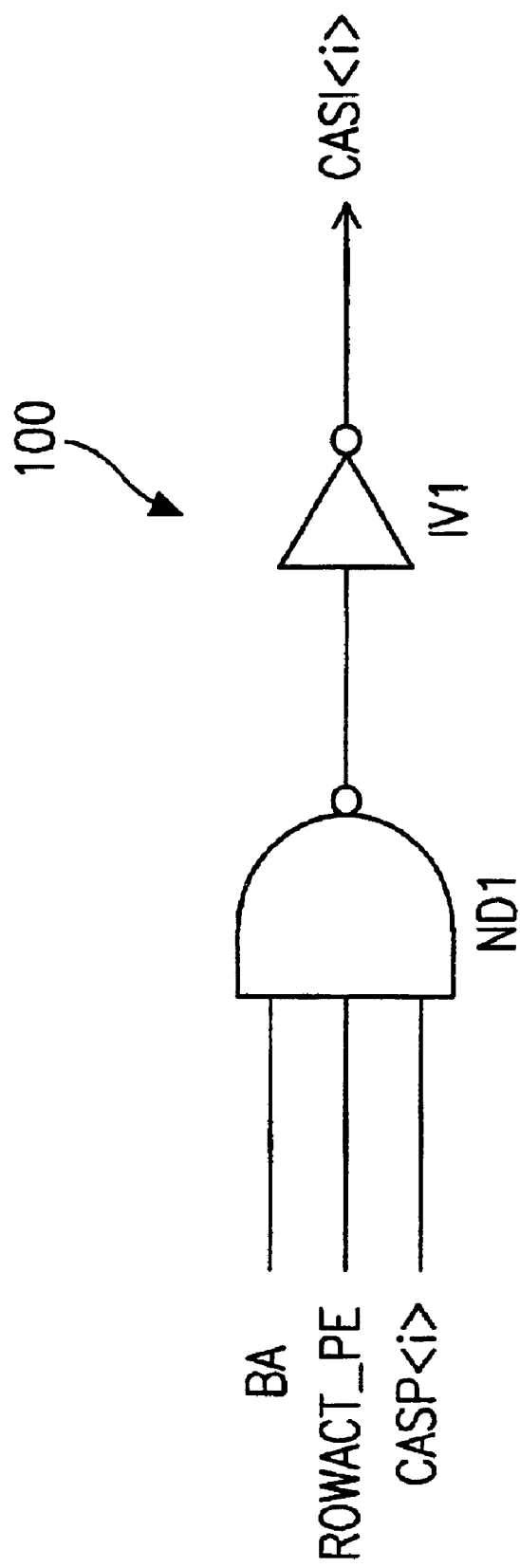
FIG. 4 is a circuit diagram illustrating an embodiment of the internal cas command signal generator in FIG. 3.

As illustrated in FIG. 4, in the internal cas command signal generator 100, a NAND gate ND1 logically combines the externally-inputted bank address BA, the row active peri signal ROWACT_PE that will be discussed later and the external cas command signal CASP<i>. An inverter IV1 inverts an output signal from the NAND gate ND1, and generates the internal cas command signal CASI<i>.

When the external cas command signal CASP<i> is generated as a high pulse, a write/read operation is performed on the semiconductor memory device. For example, when a bank 1 is activated and a bank 0 performs an auto precharge operation, a gapless write/read operation must be executed not on the bank 0 but on the bank 1.

Accordingly, when the burst operation is ended, the row active peri signal ROWACT_PE of the bank 0 performing the auto precharge operation is disabled. Then, the internal cas command signal CASI<i> is not generated and thus the write/read operation is not carried out.

However, when the cas command signal of the bank 1 (write/read operation) is executed, the row active peri signal ROWACT_PE is enabled at a high level. Thus, the internal cas command signal CASI<i> is generated as a high pulse, and the write/read operation is performed.

In order to prevent execution of the illegal command inputted to the bank performing the auto precharge operation, the row active peri signal ROWACT_PE controlling a peri circuit unit is disabled earlier than the row active core signal ROWACT_CO controlling a core circuit unit, and thus the internal cas command signal CASI<i> must be not generated.

In accordance with the present invention, the auto precharge apparatus for the semiconductor memory device does not execute the illegal command inputted to the bank performing the auto precharge operation by generating the internal cas command signal CASI<i> in response to the row active peri signal ROWACT_PE.

The structure and operation of the burst length counter 200 will be explained with reference to FIG. 5.

Figure 5:
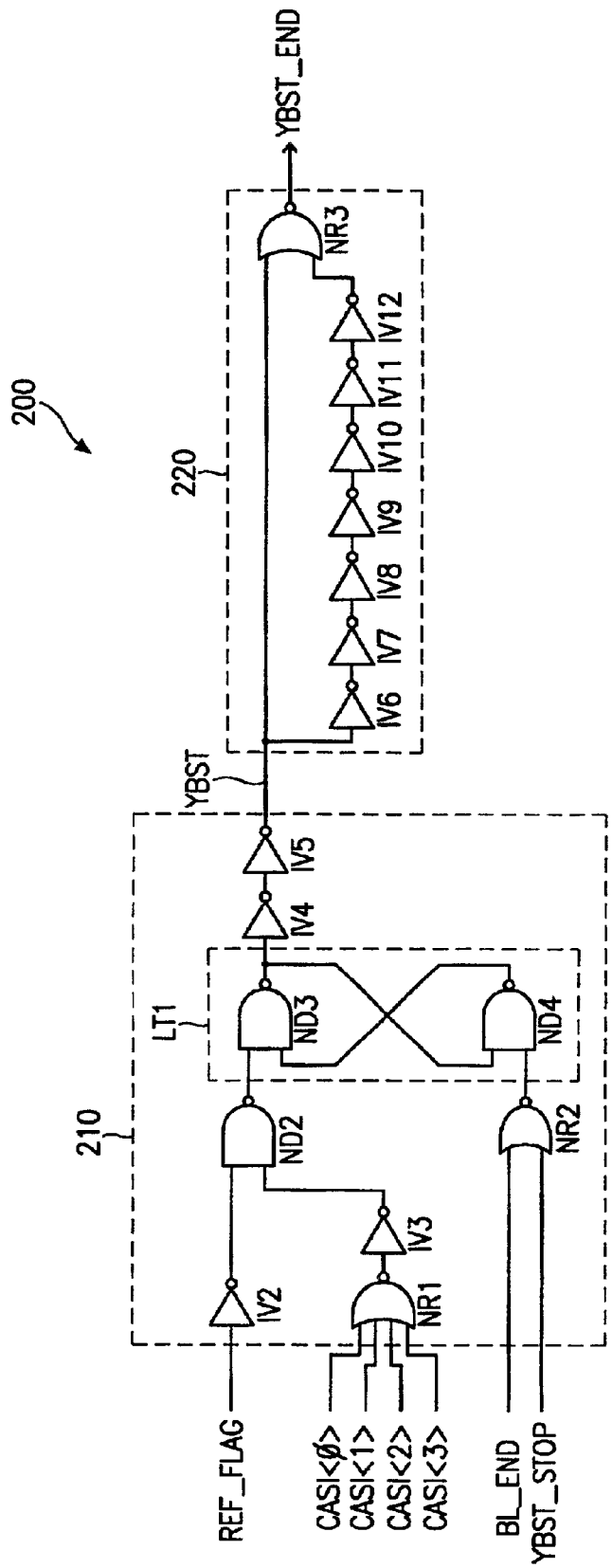
FIG. 5 is a circuit diagram illustrating an embodiment of the burst length counter in FIG. 3.

FIG. 5 is a circuit diagram illustrating the burst length counter 200 including a burst enable signal generator 210 and a burst end signal generator 220. The burst enable signal generator 210 receives the internal cas command signal CASI<0:3>, the refresh flag signal REF_FLAG indicating the refresh operation, the burst length end signal BL_END and the burst stop signal YBST_STOP, and generates a burst enable signal YBST. A burst end signal generator 220 receives the burst enable signal YBST, and generates the burst end signal YBST_END representative of an end of the burst operation.

In the burst enable signal generator 210, a NOR gate NR1 logically combines the internal cas command signals CASI<0:3>. An inverter IV2 inverts the refresh flag signal REF_FLAG. An inverter IV3 inverts an output signal from the NOR gate NR1. A NAND gate ND2 logically combines an output signal from an inverter IV2 and an output signal from an inverter IV3. A NOR gate NR2 logically combines the burst length end signal BL_END and the burst stop signal YBST_STOP. A NAND gate latch circuit LT1 latches output signals from the NOR gate NR2 and the NAND gate ND2. Inverters IV4 and IV5 consecutively invert an output signal from the NAND gate latch circuit LT1, and output the burst enable signal YBST.

The burst end signal generator 220 includes: a plurality of inverters IV6–IV12 for consecutively inverting the burst enable signal YBST; and a NOR gate NR3 for NORing an output signal from the inverter IV12 and the burst enable signal YBST, and generating the burst end signal YBST_END representative of an end of the burst operation.

When the refresh operation is performed by generating the refresh flag signal REF_FLAG showing the refresh operation state as a high pulse, the word line is enabled to carry out the write/read operation. Therefore, in the case of the refresh operation, the refresh flag signal REF_FLAG is generated as a high pulse and the burst enable signal YBST is not generated.

When the internal cas command signal CASI<0> is generated as a high pulse, the refresh flag signal REF_FLAG, the burst length end signal BL_END and the burst stop signal YBST_STOP become at a low level. Then an output signal of the NAND gate ND2 becomes at a low level, and an output signal of the NOR gate NR2 becomes at a high level. Then, an output signal of the NAND gate latch circuit LT1 becomes at a high level, and thus the burst enable signal YBST becomes at a high level. Here, the NAND gate latch circuit LT1 maintains a high level. When the burst length end signal BL_END (signal generated after finishing the normal burst operation) or the burst stop signal YBST_STOP (signal forcibly stopping the burst operation when the normal burst operation is not finished) is generated as a high pulse, the internal cas command signal CASI<0:3> and the refresh flag signal REF_FLAG are at a low level. Then, an output signal of the NAND gate ND2 becomes at a high level, and an output signal of the NOR gate NR2 becomes at a low level. Then, an output signal of the NAND gate latch circuit LT1 becomes at a low level, and thus the burst enable signal YBST becomes at a low level. When the burst enable signal YBST becomes at a low level, the burst end signal YBST_END becomes at a high pulse and immediately becomes at a low level.

The auto precharge signal generator 300 of FIG. 3 will be described with reference to FIG. 6.

Figure 6:
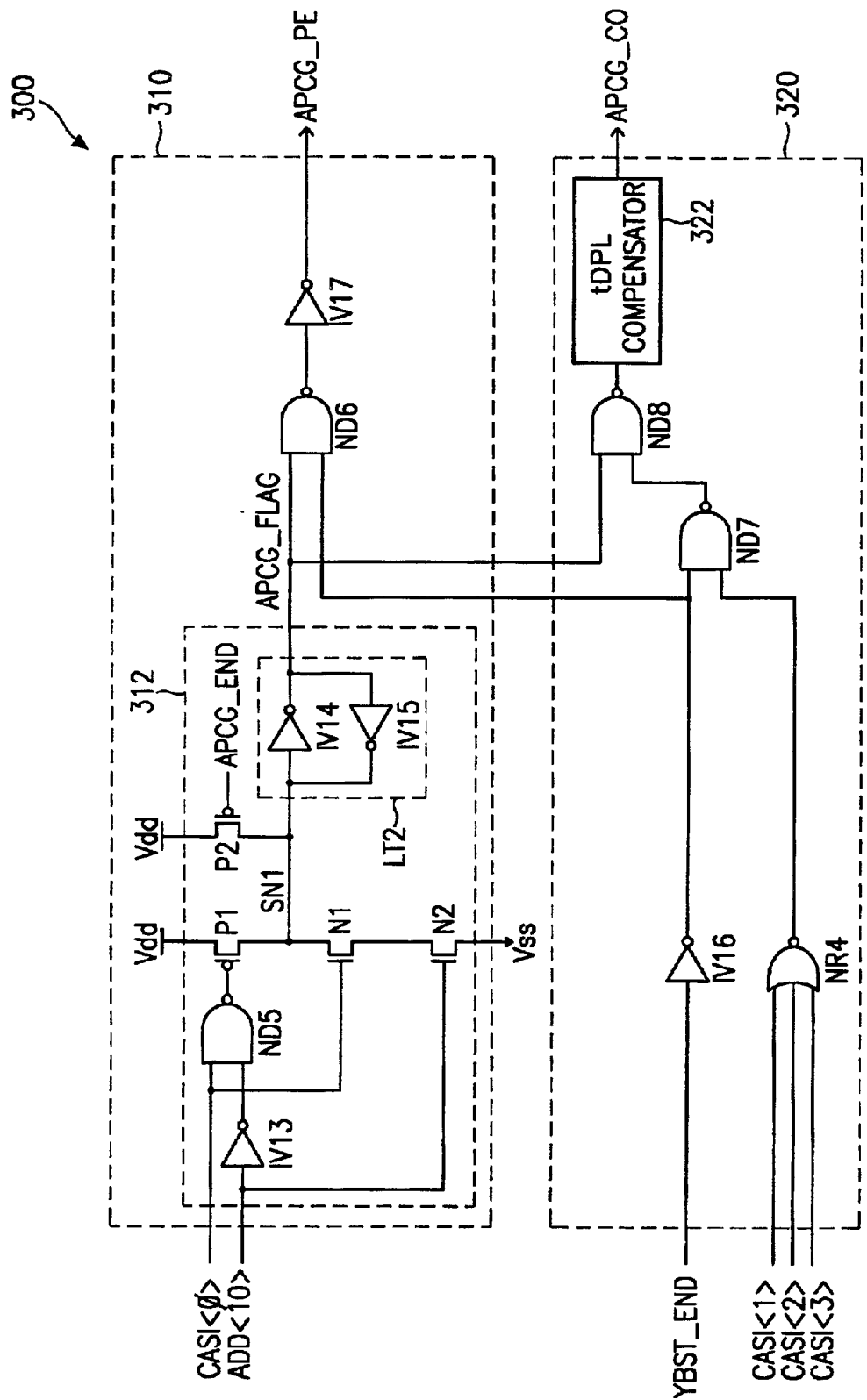
FIG. 6 is a circuit diagram illustrating an embodiment of the auto precharge signal generator in FIG. 3.

FIG. 6 is a circuit diagram illustrating the auto precharge signal generator 300 including an auto precharge peri signal generator 310 and an auto precharge core signal generator 320.

The auto precharge peri signal generator 310 receives the internal cas command signal CASI<0>, the external address ADD<10> and the auto precharge end signal APCG_END, and generates the auto precharge flag signal APCG_FLAG representative of the auto precharge operation. Then it generates the auto precharge peri signal APCG_PE by combining the auto precharge flag signal APCG_FLAG and the burst end signal YBST_END.

The auto precharge core signal generator 320 receives the internal cas command signal CAS<1:3>, the auto precharge flag signal APCG_FLAG and the burst end signal YBST_END, and generates the auto precharge core signal APCG_CO.

In addition, the auto precharge peri signal generator 310 generates the auto precharge peri signal APCG_PE to perform the precharge operation before an input of the internal cas command signal CASI<0:3>. The auto precharge core signal generator 320 compensates for the tDPL (data precharge latency), and then generates the auto precharge core signal APCG_CO to perform the precharge operation.

In auto precharge core signal generator 310, an auto precharge flag signal generator 312 receives the internal cas command signal CASI<0>, the external address ADD<10> and the auto precharge end signal APCG_END, and generates the auto precharge flag signal APCG_FLAG representative of the auto precharge operation. An NAND gate ND6 logically combines the auto precharge flag signal APCG_FLAG and an output signal from an inverter IV16.

The inverter IV16 inverts the burst end signal YBST_END. An inverter IV17 inverts an output signal from the NAND gate ND6, and generates the auto precharge peri signal APCG_PE.

In auto precharge flag signal generator 312, an inverter IV13 inverts the external address ADD<10>. An NAND gate ND5 logically combines the internal cas command signal CASI<0> and an output signal from an inverter. A PMOS transistor P1 has its source and drain respectively connected to a power supply voltage Vdd and a node SN1, and has its gate connected to receive an output signal from the NAND gate ND5. NMOS transistors N1 and N2 are connected between the node SN1 and a ground voltage Vss, and their gates connected respectively to receive the internal cas command signal CASI<0> and the external address ADD<10>. A PMOS transistor P2 has its source and drain respectively connected to the power supply voltage Vdd and the node SN1, and its gate connected to receive the auto precharge end signal APCG_END. An inverter latch circuit LT2 latches a signal from the node SN1, and generates the auto precharge flag signal APCG_FLAG.

In auto precharge core signal generator 320, a NOR gate logically combines the internal cas command signals CAS<1:3>. An inverter IV16 inverts the burst end signal YBST_END. A NAND gate ND7 logically combines an output signal from the NOR gate NR4 and an output signal from an inverter IV16. An NAND gate ND8 logically combines an output signal from the NAND gate ND7 and the auto precharge flag signal APCG_FLAG. A tDPL compensator 322 compensates for the tDPL by delaying an output signal from the NAND gate ND8 for a predetermined time, and generates the auto precharge core signal APCG_CO. The tDPL compensator 322 includes a plurality of inverters.

The operation of the auto precharge peri signal generator 310 and the auto precharge core signal generator 320 will be explained in brief.

In order to perform the auto precharge operation, the internal cas command signal CASI<0> and the external address ADD<10> must be transited to high pulse. Here, the auto precharge flag signal APCG_FLAG becomes a high pulse (prepared to generate the auto precharge peri signal APCG_PE and the auto precharge core signal APCG_CO). Thereafter, when the burst end signal YBST_END becomes a high pulse, the auto precharge peri signal APCG_PE becomes a low pulse, and the auto precharge core signal APCG_CO compensates for the tDPL and becomes a high pulse.

The structure of the internal row active signal generator 400 of FIG. 3 will be explained with reference to FIG. 7.

Figure 7:
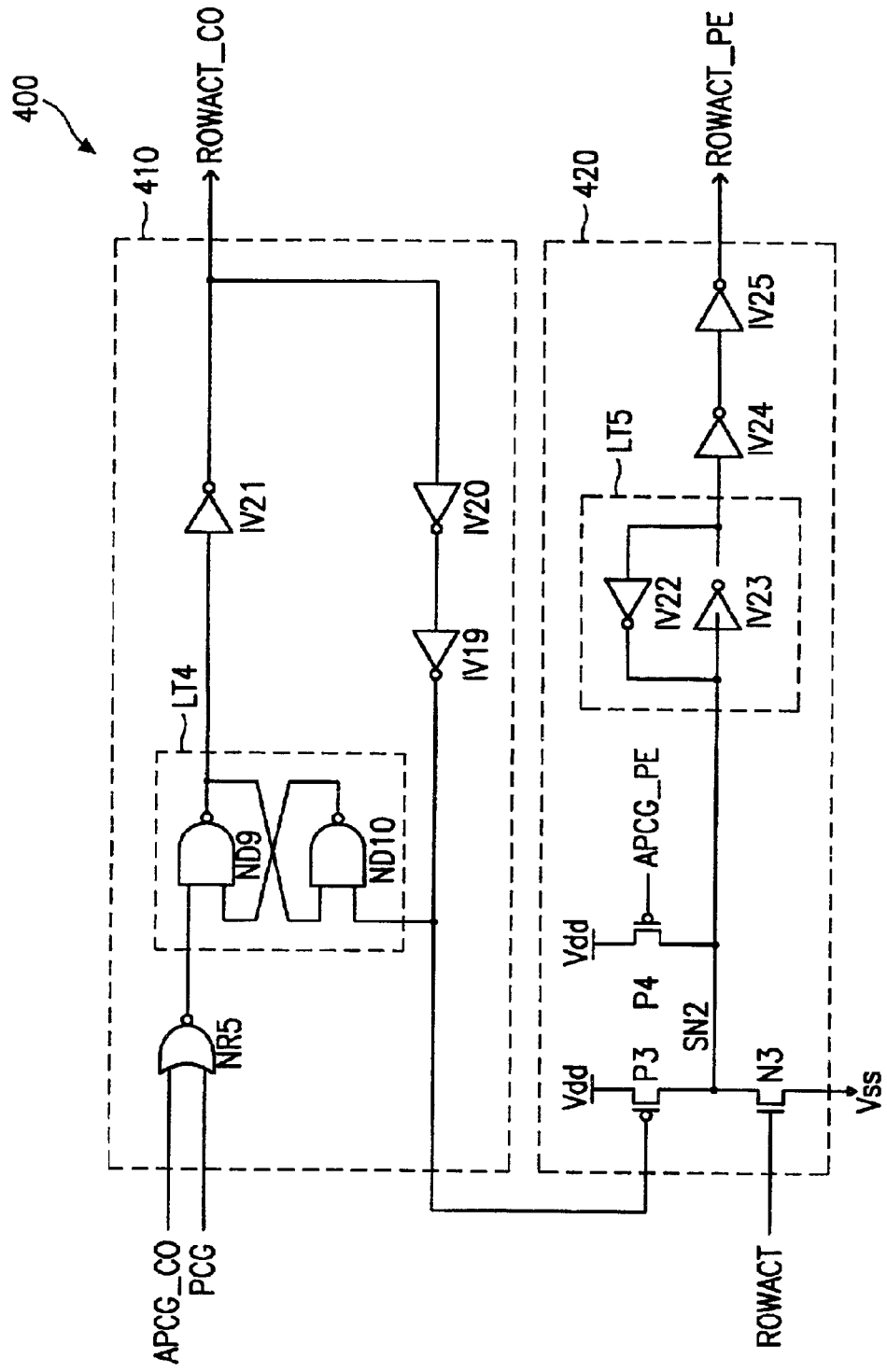
FIG. 7 is a circuit diagram illustrating an embodiment of the internal row active signal generator in FIG. 3.

FIG. 7 is a circuit diagram illustrating the internal row active signal generator 400 including a row active core signal generator 410 and a row active peri signal generator 420.

The row active core signal generator 410 receives the auto precharge core signal APCG_CO and the precharge signal PCG, and generates the row active core signal ROWACT_CO for disabling the word line. The row active peri signal generator 420 receives an inverted signal of the row active core signal ROWACT_CO, the auto precharge peri signal APCG_PE, and the external row active signal ROWACT, and generates the row active peri signal ROWACT_PE for enabling the word line.

In row active core signal generator 410, a NOR gate NR5 logically combines the auto precharge core signal APCG_CO and the precharge signal PCG. An NAND gate latch circuit LT4 latches an output signal from the NOR gate NR5 and an output signal from an inverter IV19. An inverter IV21 inverts an output signal from the NAND gate latch circuit LT4, and generates the row active core signal ROWACT_CO disabling the word line. An inverter IV20 inverts the row active core signal ROWACT_CO. The inverter IV19 inverts an output signal from the inverter IV20.

In row active peri signal generator 420, PMOS and NMOS transistors P3 and N3 are connected between the power supply voltage Vdd and the ground voltage Vss, and has their gates connected to receive the output signal from the inverter IV 19 and the externally-inputted row active signal ROWACT. A PMOS transistor P4 has its source and drain respectively connected to the power supply voltage Vdd and a node SN2, and has its gate connected to receive the auto precharge peri signal APCG_PE. An inverter latch circuit LT5 latches a signal from the node SN2. Inverters IV24 and IV25 consecutively invert an output signal from the inverter latch circuit LT5, and output the row active peri signal ROWACT_PE enabling the word line.

The operation of the row active core signal generator 410 and the row active peri signal generator 420 will be explained in brief.

When the auto precharge peri signal APCG_PE is generated as a low pulse, the row active peri signal ROWACT_PE is disabled in a low level. That is, the internal cas command signal CASI<i> shown in FIG. 3 is not generated, and thus the newly-inputted illegal command is not executed, to protect the auto precharge gapless function. Thereafter, the row active core signal ROWACT_CO compensates for the tDPL in response to the row active signal ROWACT having a high level. Then, when the auto precharge core signal APCG_CO is generated as a high pulse, the row active core signal ROWACT_CO is disabled in a low level. When the row active core signal ROWACT_CO is disabled in a low level, the word line is disabled.

Figure 8:
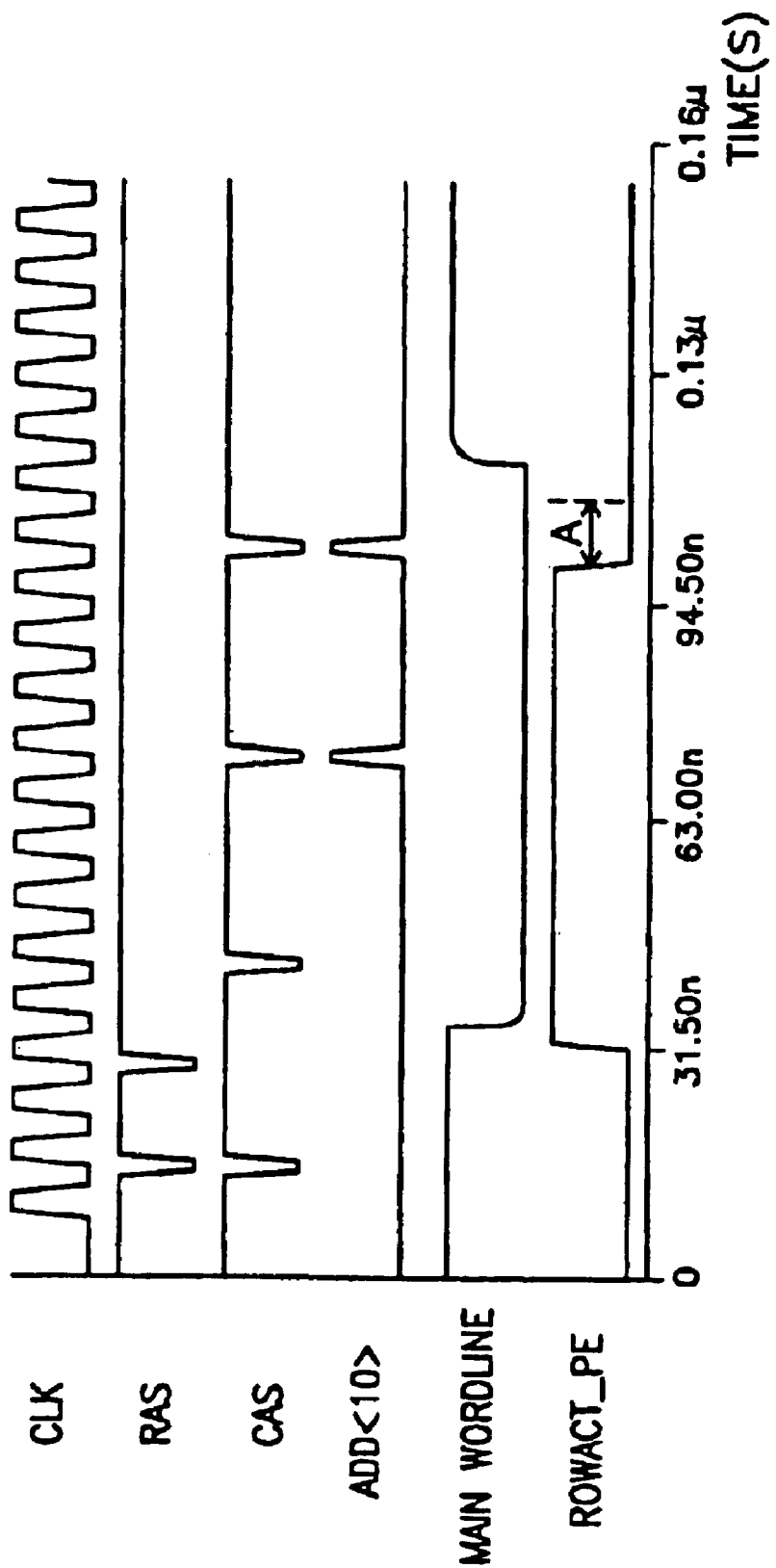
FIG. 8 is a timing diagram of the major signals of the auto precharge apparatus for the semiconductor memory device in accordance with the preferred embodiment of the present invention.

FIG. 8 is a timing diagram of the major signals of the auto precharge apparatus for the semiconductor memory device in accordance with the preferred embodiment of the present invention.

Referring to FIG. 8, the row active peri signal ROWACT_PE is disabled in a low level earlier than in the conventional auto precharge apparatus by a period A. As a result even when a read with auto precharge command which is a fourth low level signal of a cas signal is generated, a data read is not performed since the row active yen signal ROWACT_PE is disabled already. That is to say, an auto precharge gapless command such as the fourth low level signal of the cas signal, which is a newly inputted illegal command, does not trigger a data read operation. Therefore, a mis-operation of the semiconductor memory device is prevented.

As discussed earlier, in accordance with the present invention, the row active peri signal ROWACT_PE controlling the peri circuit unit is disabled earlier than the row active core signal ROWACT_CO controlling the core circuit unit in the auto precharge operation. Even if an illegal command is externally inputted, the illegal command is not executed so that a mis-operation of the semiconductor memory device is prevented.

While the invention has been shown and described with reference to certain preferred embodiments thereof, it will be understood by those skilled in the art that various changes, modifications, substitutions and addition in form and details may be made therein without departing from the spirit and scope of the invention as defined by the appended claims.

What is claimed is:

1. An auto precharge apparatus having an auto precharge gapless function protecting circuit in a semiconductor memory device, the apparatus comprising:
    an internal cas command signal generating means for receiving a bank address and an external cas command signal, and generating an internal cas command signal;
    a burst length counter for receiving the internal cas command signal and a burst stop signal, and generating a burst end signal representative of an end of a burst operation;
    an auto precharge signal generating means for receiving the burst end signal, the internal cas command signal, an auto precharge end signal and an external address, and generating an auto precharge peri signal and an auto precharge core signal; and
    an internal row active signal generating means for receiving the auto precharge peri signal, the auto precharge core signal, and an externally-inputted row active signal, and generating a row active peri signal for enabling a word line and a row active core signal for disabling the word line,
    wherein the internal cas command signal generating means determines the generation of the internal cas command signal in response to the row active peri signal for enabling the word line.

2. The apparatus according to claim 1, wherein the internal cas command signal generating means does not generate the internal cas command signal when the row active peri signal is disabled at a low level, and generates the internal cas command signal when the row active peri signal is enabled at a high level.

3. The apparatus according to claim 1, wherein the internal cas command signal generating means comprises a logic circuit for logically-combining the bank address, the external cas command signal and the row active peri signal, and generating the internal cas command signal.

4. The apparatus according to claim 1, wherein the burst length counter comprises:
    a burst enable signal generator for receiving the internal cas command signal generated in the internal cas command signal generating means, a refresh flag signal, a burst length end signal and the burst stop signal and then generating a burst enable signal; and
    a burst end signal generator for receiving the burst enable signal, and generating the burst end signal.

5. The apparatus according to claim 1, wherein the auto precharge signal generating means comprises:
    an auto precharge peri signal generator for generating an auto precharge flag signal representative of an auto precharge operation by receiving the internal cas command signal, the external address and the auto precharge end signal, and then generating the auto precharge peri signal by combining the auto precharge flag signal and the burst end signal; and
    an auto precharge core signal generator for receiving the auto precharge flag signal, the burst end signal and the internal cas command signal, and generating the auto precharge core signal.

6. The apparatus according to claim 5, wherein the auto precharge peri signal generator generates the auto precharge peri signal so that the precharge operation can be performed before an input of the internal cas command signal.

7. The apparatus according to claim 5, wherein the auto precharge peri signal generator comprises:
    an auto precharge flag signal generator for receiving the internal cas command signal, the external address and the auto precharge end signal, and generating an auto precharge flag signal representative of the autoprecharge operation; and a logic circuit for logic-combining the auto precharge flag signal and an inverted signal of the burst end signal, and generating the auto precharge peri signal.

8. The apparatus according to claim 5, wherein the auto precharge core signal generator generates the auto precharge core signal so that the precharge operation can be performed after compensating for a data precharge latency time.

9. The apparatus according to claim 5, wherein the auto precharge core signal generator comprises:

a first logic device for logically-combining a part of the internal cas command signals;

a second logic device for logically-combining an inverted signal of the burst end signal and an output signal from the first logic device;

a third logic device for logically-combining the auto precharge flag signal and an output signal from the second logic device; and a data precharge latency time compensator for compensating for the data precharge latency time by delaying an output signal from the third logic device for a predetermined time, and generating the auto precharge core signal.

10. The apparatus according to claim 1, wherein the internal row active signal generating means comprises:

a row active core signal generator for generating the row active core signal for disabling the word line in response to the auto precharge core signal and a precharge signal; and a row active peri signal generator for generating the row active peri signal for enabling the word line in response to the row active core signal, the auto precharge peri signal and the externally-inputted row active signal.

11. The apparatus according to claim 10, wherein, the row active core signal generator disables the word line by disabling the row active core signal at a low level, when the auto precharge core signal is generated as a high pulse.

12. The apparatus according to claim 10, wherein the row active core signal generator comprises:

a logic device for logic-combining the auto precharge core signal and the precharge signal;

a latch circuit for latching an output signal from the logic device;

a first inverting device for inverting an output signal from the latch circuit, and outputting the row active core signal; and a plurality of second inverting units for inverting an output signal from the first inverting unit, and transmitting a resulting signal to the latch circuit.

13. The apparatus according to claim 10, wherein, the row active peri signal generator does not execute a newly-inputted illegal command by disabling the row active peri signal at a low level, when the auto precharge peri signal is generated as a low pulse.

14. The apparatus according to claim 10, wherein the row active peri signal generator comprises:

pull-up and pull-down devices connected between a power supply voltage and a ground voltage, for responding to an inverted signal of the row active core signal and the external row active signal;

a transistor connected between the power supply voltage and an output node, for responding to the auto precharge peri signal;

a latch circuit for latching a signal of the output node; and a plurality of inverters for consecutively inverting an output signal from the latch circuit.

* * * * *